United States Patent
Son et al.

(10) Patent No.: US 11,417,283 B2
(45) Date of Patent: Aug. 16, 2022

(54) DISPLAY DEVICE FOR LOW-SPEED DRIVING AND DRIVING METHOD THEREOF

(71) Applicant: LG Display Co., Ltd., Seoul (KR)

(72) Inventors: Sungyoung Son, Hadong-gun (KR); Suhyeon Jo, Goyang-si (KR); Dongseok Ahn, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/071,619

(22) Filed: Oct. 15, 2020

(65) Prior Publication Data

US 2021/0118378 A1  Apr. 22, 2021

(30) Foreign Application Priority Data

Oct. 17, 2019 (KR) .................. 10-2019-0129264

(51) Int. Cl.
*G09G 3/3291* (2016.01)
*H01L 27/32* (2006.01)

(52) U.S. Cl.
CPC ....... *G09G 3/3291* (2013.01); *H01L 27/3262* (2013.01); *H01L 27/3265* (2013.01); *G09G 2310/08* (2013.01)

(58) Field of Classification Search
CPC .... G09G 3/3291; G09G 3/006; G09G 3/3233; G09G 3/3275; G09G 2310/08; G09G 2330/12; G09G 2340/0435; H01L 27/3262; H01L 27/3265
See application file for complete search history.

(56) References Cited

U.S. PATENT DOCUMENTS

| | | | |
|---|---|---|---|
| 6,603,454 B1 | 8/2003 | Nakamura et al. | |
| 2004/0207615 A1* | 10/2004 | Yumoto | G09G 3/325 345/211 |
| 2005/0001812 A1* | 1/2005 | Amundson | G09G 3/2011 345/107 |
| 2009/0174731 A1 | 7/2009 | Kim et al. | |
| 2010/0328285 A1 | 12/2010 | Jarupoonphol et al. | |

(Continued)

FOREIGN PATENT DOCUMENTS

| | | |
|---|---|---|
| KR | 10-2009-0076582 A | 7/2009 |
| KR | 10-2014-0051745 A | 5/2014 |
| KR | 10-2019-0034729 A | 4/2019 |

OTHER PUBLICATIONS

Non-Final Office Action, dated Dec. 8, 2021, for U.S. Appl. No. 17/129,108, Ahn et al., "Display Device and Driving Method Thereof," 16 pages.

*Primary Examiner* — Shaheda A Abdin
(74) *Attorney, Agent, or Firm* — Seed IP Law Group LLP

(57) ABSTRACT

Disclosed herein are a display device for low-speed driving and a driving method thereof. The display device according to embodiments of the present disclosure may set a reference compensation voltage for compensating a node voltage of each pixel during an image holding period after a refresh period where image data are input at the time of low-speed driving, and may compensate a node voltage of each sub pixel on the basis of a unit of at least one frame during each image holding period between the refresh periods, thereby making it possible to prevent a deterioration of image quality and reduce electricity consumption.

16 Claims, 5 Drawing Sheets

(56) References Cited

U.S. PATENT DOCUMENTS

| | | | |
|---|---|---|---|
| 2015/0091950 A1* | 4/2015 | Park | G09G 3/3291 |
| | | | 345/690 |
| 2016/0035320 A1* | 2/2016 | Yoon | G09G 3/20 |
| | | | 345/690 |
| 2016/0217739 A1 | 7/2016 | Kang et al. | |
| 2018/0005576 A1* | 1/2018 | Yoon | G09G 3/3233 |
| 2018/0061915 A1* | 3/2018 | Yu | H01L 27/3262 |
| 2018/0158418 A1* | 6/2018 | Ryu | H01L 27/3276 |
| 2018/0268780 A1* | 9/2018 | Bae | G09G 3/20 |
| 2019/0057978 A1* | 2/2019 | Kim | G09G 3/3258 |
| 2021/0110771 A1 | 4/2021 | Lee et al. | |
| 2021/0201800 A1 | 7/2021 | Ahn et al. | |
| 2021/0295790 A1 | 9/2021 | Zhang | |

* cited by examiner

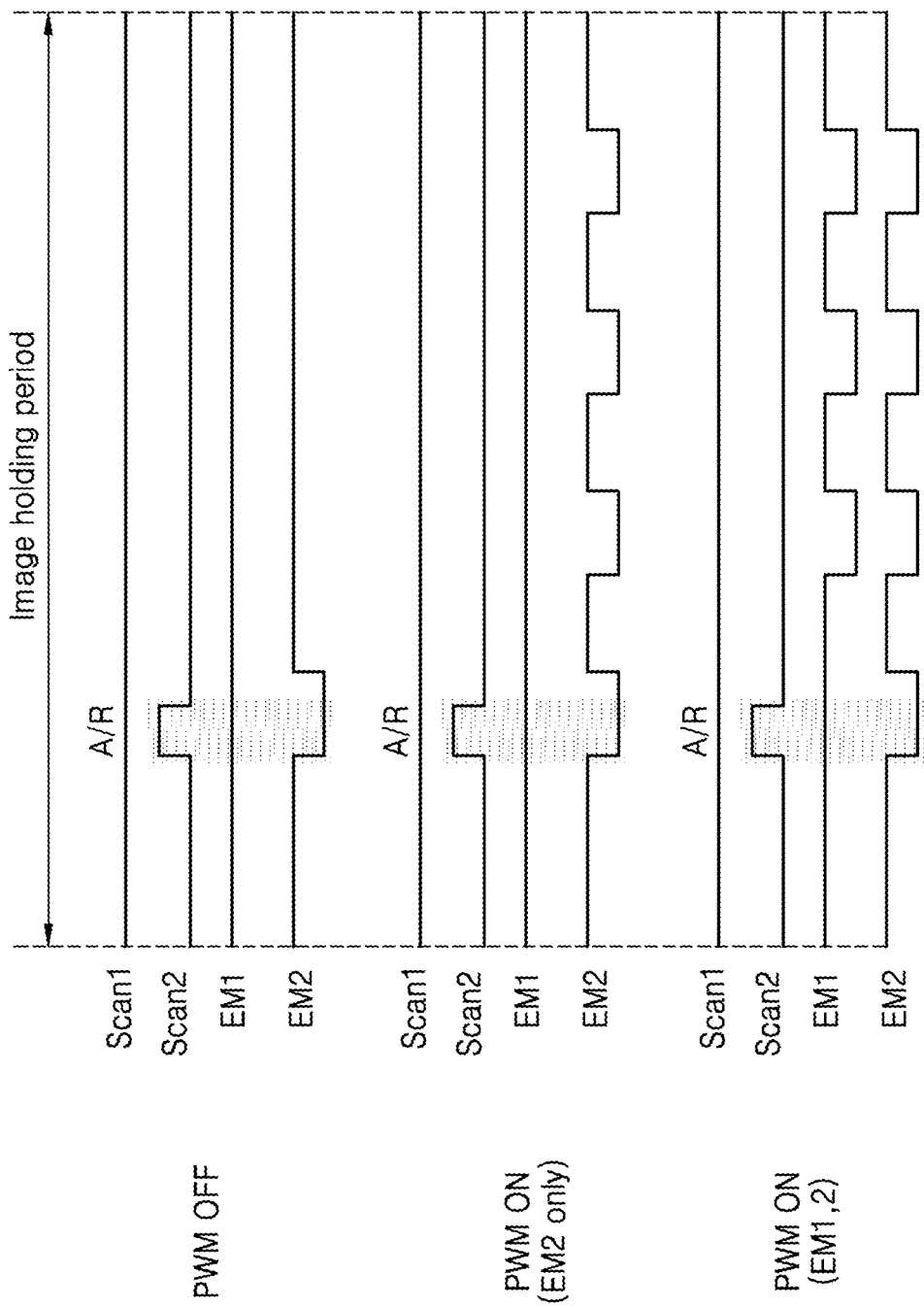

DISPLAY DEVICE FOR LOW-SPEED DRIVING AND DRIVING METHOD THEREOF

CROSS-REFERENCE TO RELATED APPLICATION

This application claims priority to and the benefit of Korean Patent Application No. 10-2019-0129264, filed in Korea on Oct. 17, 2019, the disclosure of which is incorporated herein by reference in its entirety.

BACKGROUND

Technical Field

The present disclosure relates to a display device for low-speed driving and a driving method thereof capable of compensating a node voltage of each pixel during a period where a displayed image is held at the time of low-speed driving, thereby preventing a deterioration of image quality and reducing electricity consumption.

Description of the Related Art

Display devices comprising an organic light-emitting diode display device and the like have been used for a variety of display devices such as a mobile information appliance, an office appliance, a computer, a TV set and the like. They may include a display panel for displaying an image, and gate and data drivers and the like for driving the display panel.

As a means to reduce electricity consumption of the display devices, a technology of low-speed driving has been widely known.

The low-speed driving technology may include a technology for holding an image of an input frame during a plurality of frame periods or a technology for refreshing an entire screen of a display panel at a frame frequency lower than a driving frequency, and the like. The low-speed driving technology may also be specifically applied in the case where there is a small change in input images.

At the time of low-speed driving, a period, during which an image of an input frame is held for a plurality of frame periods, is lengthened. Accordingly, a refresh period, during which image data are written and displayed as an image, may also be lengthened. When the image refresh period is lengthened, an image data voltage may not be maintained at a target level and may leak or may be lowered during a period where the image is held.

For example, a 1 frame for low-speed driving of 1 Hz is one second, and is one frame longer than a 1 frame for high-speed driving of 120 Hz and 180 Hz and the like. Accordingly, a leakage occurs and a target voltage level is lowered during a period where luminance implemented in each image display pixel reaches a target level or a period where luminance has to be maintained. In this case, display luminance may vary.

BRIEF SUMMARY

In a low-speed driving technology of the related art, node voltages of optimized pixels may vary during an image holding period under driving conditions based on a refresh cycle and period. When the node voltages of the pixels vary during the image holding period, a deterioration of image quality such as a flicker may occur.

When the node voltages of the pixels vary or when a leakage occurs, brightness and luminance features of a displayed image may be shifted. Accordingly, quality of the displayed image may be further deteriorated. In this case, application of the low-speed driving technology for reducing electricity consumption is not meaningful.

As a means to solve the above-described problems, the present disclosure is directed to a display device for low-speed driving and a driving method thereof that may set a reference compensation voltage for compensating a node voltage of each pixel during an image holding period after a refresh period where image data are input at the time of low-speed driving and that may compensate a node voltage of each sub pixel on the basis of a unit of at least one frame during each image holding period between the refresh periods, thereby making it possible to prevent a deterioration of image quality and to reduce electricity consumption.

Aspects of the present disclosure are not limited to the above-described ones. Additionally, other aspects that have not been mentioned may be clearly understood from the following description by one having ordinary skill in the art to which the disclosure pertains.

An optical compensation tester according to embodiments may measure a change in brightness and luminance features of an image that is displayed when a display panel is driven at slow speed on the basis of a unit of a plurality of predetermined frames in a step of testing the display panel, and may set a level of a reference compensation voltage for compensating a node voltage of each pixel during an image holding period after a refresh period where image data are input at the time of low-speed driving, on the basis of a degree of the change in the brightness and luminance features of the image.

A timing controller for controlling a driving timing of the display panel may align image data in accordance with a driving frequency of the display panel, may supply the aligned image data to a data driver, and may control an output timing of a gate driving signal of a gate driver.

Under the control of the timing controller, the data driver may consecutively supply an image data voltage based on the image data to each sub pixel during the refresh period set in a driving frequency of the display panel, and may supply the reference compensation voltage to each sub pixel during the image holding period to maintain the image data voltage.

In a display device for low-speed driving and a driving method thereof according to embodiments of the present disclosure, a reference compensation voltage for compensating a node voltage of each pixel may be set during an image holding period after a refresh period where image data are input at the time of low-speed driving, and node voltages of all sub pixels may be compensated by the reference compensation voltage on the basis of a unit of at least one frame during each image holding period between the refresh periods.

Thus, the display device for low-speed driving and the driving method thereof according to the present disclosure may prevent a deterioration of image quality and may reduce electricity consumption during the image holding period.

Advantages of the present disclosure are not limited to the above-described ones. Additionally, other advantages that have not been mentioned may be clearly understood from the following description by one having ordinary skill in the art to which the disclosure pertains.

BRIEF DESCRIPTION OF THE SEVERAL VIEWS OF THE DRAWINGS

The accompanying drawings constitute a part of this specification, illustrate one or more embodiments of the present disclosure, and together with the specification, explain the present disclosure, wherein:

FIG. 6 is a control signal timing chart illustrating gate driving signals input to sub pixels on the basis of a change in driving frequencies of a display panel during an image holding period according to another embodiment.

DETAILED DESCRIPTION

Figure 1:
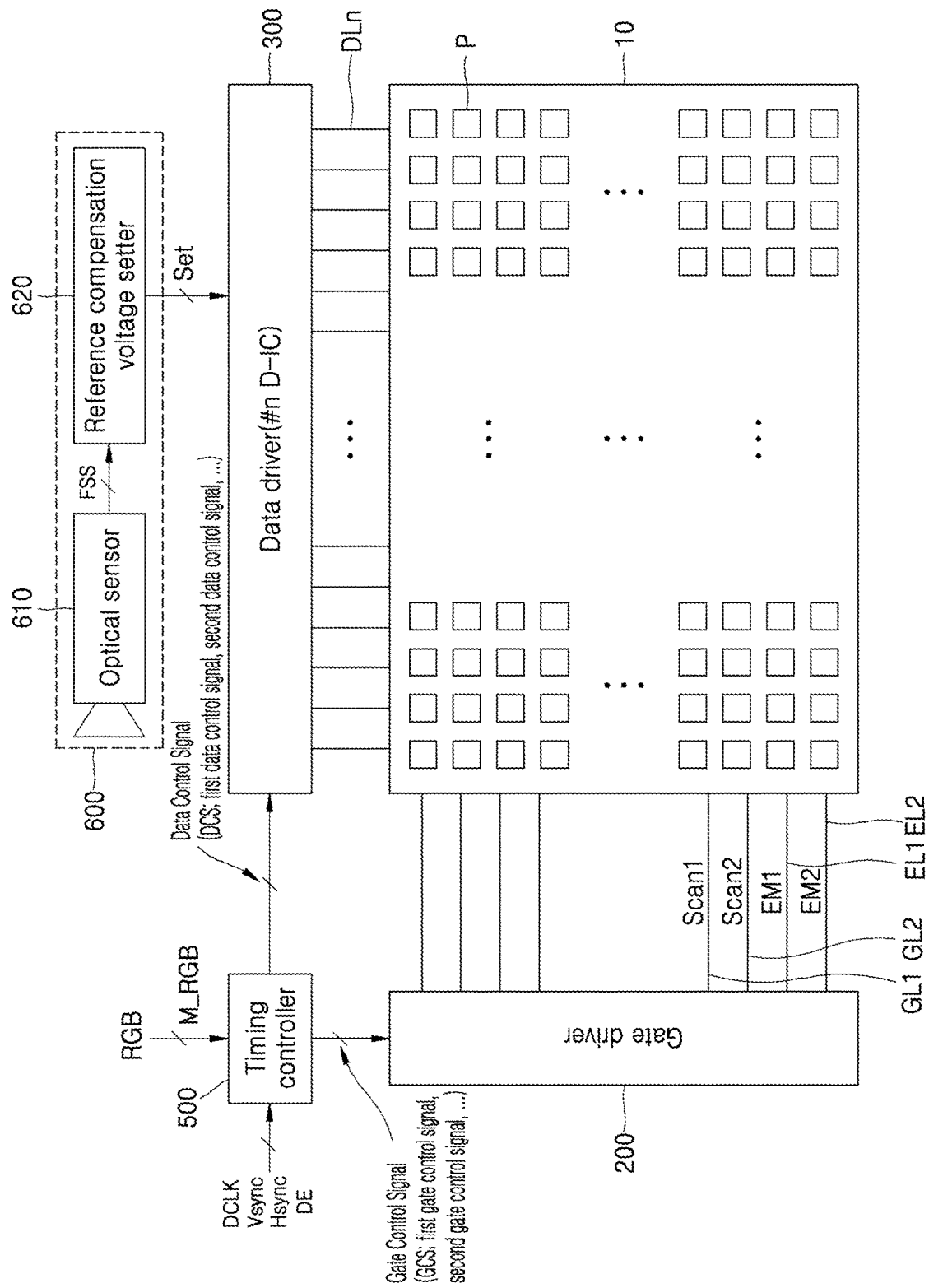
FIG. 1 is a block diagram illustrating a display device for low-speed driving according to an embodiment.

The above-described aspects, features and advantages are specifically described with reference to the accompanying drawings hereunder such that one having ordinary skill in the art to which the present disclosure pertains may easily implement the technical spirit of the disclosure. In describing the disclosure, detailed description of known technologies in relation to the disclosure is omitted if it is deemed to make the gist of the present disclosure unnecessarily vague.

When any pixel or any component is described as being "on (or under)" a component, any pixel or component may be placed on the upper surface (or the lower surface) of the component, and an additional component may be interposed between the component and any component placed on (or under) the component, along an arrangement direction in the drawings. Throughout the drawings, identical reference numerals denote identical or similar components.

Below, a display device for low-speed driving and a driving method thereof according to embodiments of the present disclosure are described with reference to the accompanying drawings. An organic light-emitting diode display device to which an organic light-emitting diode display panel is applied is described as an example of the display device.

FIG. 1 is a block diagram illustrating a display device for low-speed driving according to an embodiment.

The display device illustrated in FIG. 1 may comprise a display panel 10, a gate driver 200, a data driver 300, a timing controller 500 and a power supply (not illustrated).

The display panel 10 may display an image using a sub pixel (P) respectively provided in pixel areas. In the display panel 10, a plurality of R (red), G (green) and B (blue) sub pixels (P) or a plurality of R, G, B and W (white) sub pixels (P) are arranged in a matrix form in each pixel area to display an image. Each sub pixel (P) may comprise an organic light-emitting diode and a pixel circuit that drives independently the light-emitting diode.

Pixel circuits of each sub pixel (P) may maintain a light-emitting state while driven and maintain charge of an image data voltage (e.g., an analogue image voltage) such that an OLED driving voltage, corresponding to the image data voltage from a data line (DL) to which each pixel circuit is connected, is supplied to the organic light-emitting diode.

A specific structure of each sub pixel (P), i.e., specific structures and features of operations of the organic light-emitting diode and the pixel circuit are described with reference to FIG. 2 and FIGS. 5, 6 and the like that are attached hereunder.

The timing controller 500 in FIG. 1 may align image data input through an external device such as a graphic system and the like in accordance with driving features including resolution, a driving frequency for low-speed driving and the like of the display panel 10, and may transmit the aligned image data to the data driver 300.

The timing controller 500 may control a driving timing of the gate and data drivers 200, 300 such that the display panel 10 is driven on the basis of a plurality of frame periods that are divided into a refresh period and an image holding period according to the driving frequency of the display panel 10. Accordingly, the timing controller 500 may arrange image data on the basis of a unit of sub pixels in each horizontal line according to the driving frequency for low-speed driving such that an image data voltage is supplied to the sub pixels during the predetermined refresh period. For example, the timing controller 500 may arrange image data on the basis of the unit of sub pixels in each horizontal line such that the image data voltage is consecutively supplied to each sub pixel during the refresh period based on 1-Hz-driving. Additionally, the image data aligned on the basis of a unit of the refresh period may be consecutively transmitted to the data driver 300 while transmission of the image data is stopped during an image holding period after the refresh period.

The timing controller 500 may generate first and second gate control signals, and first and second data control signals such that the gate and data drivers 200, 300 are driven in accordance with the driving frequency for low-speed driving using synchronization signals (DCLK, Vsync, Hsync and DE) input from the outside. Specifically, the timing controller 500 may generate first gate and first data control signals such that each sub pixel consecutively displays an image during the refresh period of the low-speed driving period. Additionally, the timing controller 500 may generate second gate and second data control signals to hold an image displayed by each sub pixel (P) on the basis of a unit of each frame during the image holding period. The timing controller 500, as described above, may supply the first and second gate signals and the first and second data control signals to the gate driver 200 and the data driver 300 during each of the refresh period and the image holding period, to control a driving timing of the gate and data drivers 200, 300.

The gate driver 200 may consecutively generate a plurality of first and second scan pulses during the refresh period in response to the first gate control signal input from the timing controller 500 during the refresh period, e.g., a first gate start pulse and a first gate shift clock and the like, and may control pulse widths of the first and second scan pulses according to a gate output enable signal. Additionally, the gate driver 200 may consecutively supply each scan pulse to each gate line (GL).

Further, the gate driver 200 may consecutively generate a plurality of first and second light emission control signals in response to the first gate start pulse and a plurality of first gate shift clocks and the like, and may consecutively supply each light emission control signal to each light emission control line (EL) during the refresh period.

Likewise, the gate driver 200 may consecutively generate a plurality of first and second scan pulses during each frame period of the image holding period in response to the second gate control signal input from the timing controller 500 during an image display period, e.g., a second gate start pulse and a second gate shift clock and the like, and may control pulse widths of the first and second scan pulses according to a gate output enable signal. Additionally, the gate driver 200 may consecutively supply each scan pulse to each gate line (GL). Further, the gate driver 200 may consecutively generate a plurality of first and second light emission control signals in response to the second gate start pulse and the second gate shift clocks and the like, and may consecutively supply each light emission control signal to each light emission control line (EL) even during the image holding period.

The data driver 300 may consecutively supply an image data voltage based on image data to each sub pixel (P) under the control of the timing controller 500 during the refresh period, and may supply a reference compensation voltage to each sub pixel (P) on the basis of a unit of at least one frame and may drive each data line (DLn) such that the image data voltage is maintained during the image holding period after the refresh period.

Specifically, the data driver 300 may latch the aligned image data from the timing controller 500 on the basis of the unit of each horizontal line, using the first source start pulse and the first source shift clock and the like among the first data control signals from the timing controller 500. That is, the data driver 300 may latch and convert an image data voltage on the basis of the unit of each horizontal line during each refresh period such that the image data voltage is consecutively supplied to each sub pixel. Additionally, the data driver 300 may supply the image data voltage to each data line (DL) in response to a source output enable signal on the basis of the unit of each horizontal line. Further, the data driver 300 may supply a reference compensation voltage to each data line (DL) during each frame period on the basis of the unit of the horizontal line in response to the second data control signal during the image holding period. A voltage level of the reference compensation voltage may be set and generated to vary on the basis of a unit of at least one frame according to a compensation voltage level set by an additional optical compensation tester 600.

Figure 2:
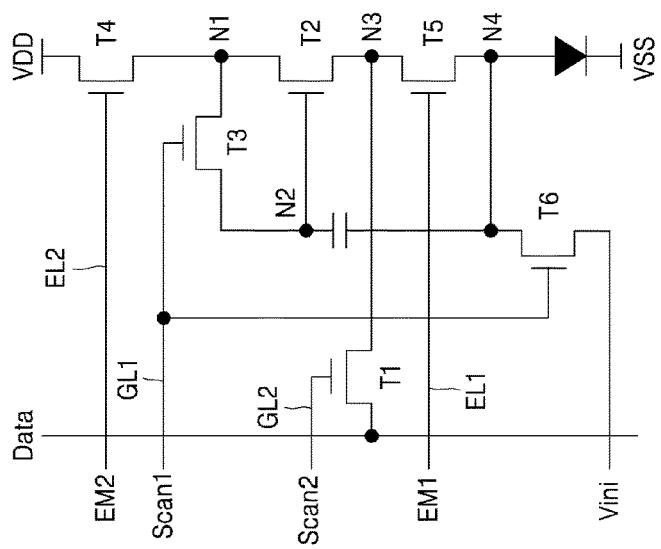
FIG. 2 is a circuit diagram illustrating any one sub pixel of the display panel in FIG. 1.

FIG. 2 is a circuit diagram illustrating any one sub pixel of the display panel in FIG. 1.

Referring to FIG. 1 and FIG. 2, each sub pixel (P) may receive a first scan signal (Scan1) through a first gate line (GL1), and a second scan signal (Scan2) through a second gate line (GL2). Additionally, each sub pixel may receive first and second light emission control signals (EM1 and EM2) through first and second light emission control lines (EL1 and EL2), and may receive a data voltage and a reference compensation voltage through a data line (DL). Further, each sub pixel may receive a high-potential voltage (VDD), a low-potential voltage (VSS) and an initialization voltage (Vini) through power supply lines.

An organic light-emitting diode of each sub pixel (P) may comprise an anode, a cathode, and an organic light-emitting layer between the anode and the cathode.

A pixel circuit, which controls driving of the organic light-emitting diode, may have a source follower-type compensation circuit structure and may comprise first to fifth switching elements (T1 to T5), a storage capacitor (C), a driving switching element (DT) and the like. The pixel circuit in the disclosure may not be limited to a source follower-type compensation circuit structure and may be applied to internal compensation circuits that are differently designed.

The first switching element (T1) of the pixel circuit may be switched (turned on) by a second scan signal (Scan2) from the second gate line (GL2) and may consecutively transmit an image data voltage (Data) or a reference compensation voltage input from a corresponding data line (DL) to a third node (N3) to which the driving switching element (DT) connects.

The second switching element (T2) may be switched (turned on) by a first scan signal (Scan1) from the first gate line (GL1) and may supply an initialization voltage (Vini), input from the data driver 300 or the power supply, to a fourth node (N4) and the fourth switching element (T4) to which the storage capacitor (C) and the driving switching element (DT) connect.

The third switching element (T3) may be switched (turned on) by a charge and discharge voltage of the storage capacitor (C) and may transmit an initialization voltage (Vini) or a high-potential voltage (VDD) to the third node (N3) to which the driving switching element (DT) connects.

The fourth switching element (T4) may be switched (turned on) by the first scan signal (Scan1) from the first gate line (GL1) and may supply an initialization voltage (Vini) input through the second switching element (T2) and the storage capacitor (C) to a first node (N1) to which the driving switching element (DT) and the fifth switching element (T5, a light emission control element) connect.

The fifth switching element (T5), which is a light emission control element, may be switched (turned on) by the second light emission control signal (EM2) input through the second light emission control line (EL2) and may supply a high-potential voltage (VDD) input through the power supply (not illustrated) and the like to the first node (N1) connected with the third switching element (T3).

The driving switching element (DT) has a structure in which a source terminal is connected to the third node (N3) connected with the third switching element (T3), in which a drain terminal is connected to the fourth node (N4) connected with the organic light-emitting diode, and in which a gate terminal is connected to a first light emission control line. Accordingly, the driving switching element (DT) may allow a threshold voltage (Vth) to be stored in the storage capacitor (Cst) by an initialization voltage (Vini), and may be switched (turned on) by the first light emission control signal (EM1) input through the first light emission control line (EL1). When an image data voltage is input during the refresh period, the driving switching element (DT) may supply an OLED driving voltage, having magnitude corresponding to magnitude of the image data voltage where a threshold voltage (Vth) is compensated, to an organic light-emitting diode, and may control the organic light-emitting diode such that the organic light-emitting diode emits light. Additionally, the driving switching element (DT) may supply an OLED driving voltage, having magnitude corresponding to magnitude of a reference compensation voltage where a threshold voltage (Vth) is compensated, to an organic light-emitting diode, and may control the organic light-emitting diode such that the organic light-emitting diode keep on emitting light, during the image holding period.

Figure 3:
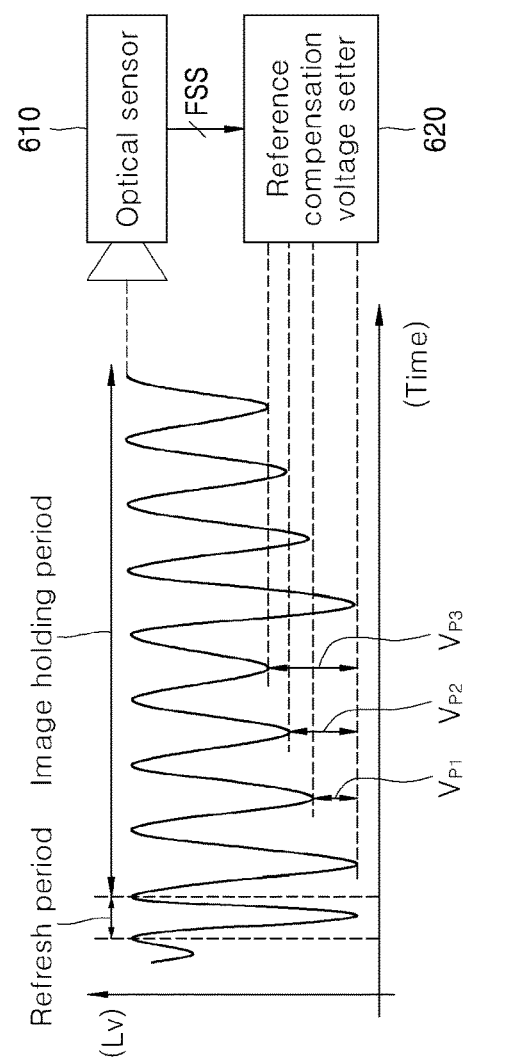
FIG. 3 is a view for describing a setting method of a reference compensation voltage of the optical compensation tester in FIG. 1.

FIG. 3 is a view for describing a setting method of a reference compensation voltage of the optical compensation tester in FIG. 1.

Referring to FIG. 1 and FIG. 3, the optical compensation tester 600 may comprise an optical sensor 610, and a reference compensation voltage setter 620.

During a refresh period where an image data voltage is input to all the sub pixels (P), of a frame period where all the sub pixels (P) of the display panel 10 emit light and display an image, brightness and luminance may vary. However, during the image holding period where the image data voltage is being held, brightness and luminance of a displayed image increase as all the sub pixels (P) maintain a light-emitting state for a long time. Accordingly, the optical compensation tester 600 may respectively detect and set a level of a reference compensation voltage (Vp1, Vp2 and Vp3) for lowering a node voltage of each sub pixel (P) not to cause an increase in brightness and luminance displayed through all the sub pixels (P) during the image holding period. The reference compensation voltage (Vp1, Vp2 and Vp3) is an analogue voltage supplied to each sub pixel (P) through a data line (DL) during at least one frame period of the image holding period.

To respectively detect and set a reference compensation voltage (Vp1, Vp2 and Vp3) level, the optical compensation tester 600 may measure a change in features of brightness and luminance of an image which is displayed when the display panel 10 is driven at low speed, on the basis of a unit of a plurality of predetermined frames in a step of testing the display panel 10. The optical compensation tester 600 may set a level of a reference compensation voltage for compensating a node voltage of each sub pixel during the image holding period after the refresh period where image data are input on the basis of a degree of a change in brightness and luminance features of the image.

Specifically, the optical sensor 610 of the optical compensation tester 600 may measure and detect a change in brightness and luminance features of the display panel 10 on the basis of a unit of at least one frame using at least one photo sensor and the like.

The reference compensation voltage setter 620 may set a level of a reference compensation voltage for compensating a node voltage of each sub pixel during the image holding period on the basis of an amount of change in brightness and luminance features, which is measured and detected on the basis of the unit of at least one frame. Additionally, the reference compensation voltage setter 620 may transmit a setting code or information, corresponding respectively to the reference compensation voltage level set on the basis of the unit of at least one frame, to each data driving IC (#n D-IC) included in the data driver 300. The reference compensation voltage level (or a voltage value) may be set and generated such that the reference compensation voltage level varies on the basis of the unit of at least one frame according to the reference compensation voltage level set by the reference compensation voltage setter 620.

Specifically, the reference compensation voltage setter 620 may set a reference compensation voltage level ((Vp1) or a voltage value) of a first frame such that the reference compensation voltage level of the first frame corresponds to an amount of change in brightness and luminance features of the first frame during the image holding period, i.e., an amount of change in brightness and luminance features of the first frame during the image holding period versus brightness and luminance features during the refresh period.

Then the reference compensation voltage setter 620 may set a reference compensation voltage level (Vp2) of a second frame such that the reference compensation voltage level of the second frame corresponds to an amount of change in brightness and luminance features of the second frame during the image holding period, i.e., an amount of change in brightness and luminance features of the second frame during the image holding period versus brightness and luminance features during the refresh period.

Further, the reference compensation voltage setter 620 may set a reference compensation voltage level (Vp3) of a third frame such that the reference compensation voltage level of the third frame corresponds to an amount of change in brightness and luminance features of the third frame during the image holding period, i.e., an amount of change in brightness and luminance features of the third frame during the image holding period versus brightness and luminance features during the refresh period. The number of frames that set the reference compensation voltage level may be set differently on the basis of a driving frequency (e.g., 60 Hz, 120 Hz, 180 Hz, 240 Hz and the like) of the display panel 10.

Figure 4:
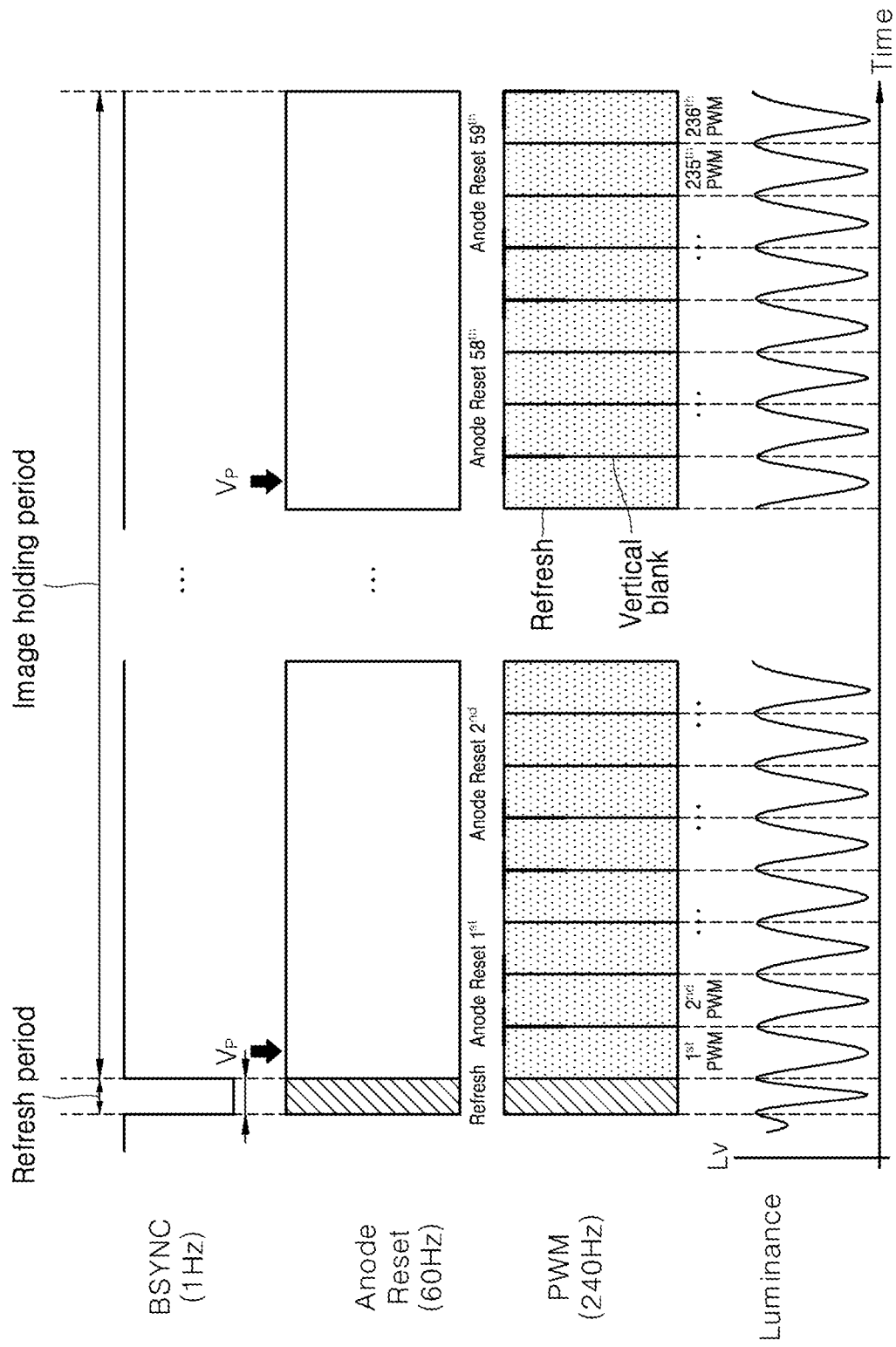
FIG. 4 is a view for describing an image display method for each frame of the gate and data drivers in FIG. 1.

FIG. 4 is a view for describing an image display method for each frame of the gate and data drivers in FIG. 1.

The reference compensation voltage setter 620, as described above, may set a reference compensation voltage level on the basis of the number of frames for applying a reference compensation voltage according to a driving frequency (e.g., 60 Hz, 120 Hz, 180 Hz, 240 Hz and the like) of the display panel 10, and then may transmit a setting code or information based on the reference compensation voltage level to the data driver 300.

Accordingly, each data driving IC (#n D-IC) included in the data driver 300 may latch and convert image data and may supply the latched and converted image data to each data line (DL), such that an image data voltage is consecutively supplied to each sub pixel on the basis of a unit of each horizontal line during the refresh period where an image is written.

During the image holding period (Anode Reset 1st to 59th) after the refresh period where an image is displayed, each data driving IC may consecutively generate a reference compensation voltage (Vp1, Vp2 and Vp3) corresponding to the reference compensation voltage level and may supply the generated reference compensation voltage to each data line (DL) and each sub pixel (P).

Referring to FIG. 4, in case the display panel 10 is driven at a driving frequency of 60 Hz (Anode Reset (60 Hz)), an image data voltage may be consecutively written in each sub pixel (P), and a frame image may be displayed during a first frame period that is the refresh period. Next, the rest second frame period (Anode Reset (1st)) to sixtieth frame period (Anode Reset (59th)) may serve as the image holding period. The reference compensation voltage (Vp1, Vp2 and Vp3) may be consecutively written in each sub pixel (P) during a period, which serves as the image holding period, from the second frame period (Anode Reset (1st)) to at least one frame period, such that the image data voltage is maintained.

The reference compensation voltage (Vp1, Vp2 and Vp3), as described above, is a voltage set for lowering a node voltage of each sub pixel (P) such that brightness and luminance displayed through all the sub pixels (P) do not increase during the image holding period. Accordingly, the reference compensation voltage may lower the node voltage of each sub pixel (P) to a predetermined reference compensation voltage (Vp1, Vp2 and Vp3) level during the image holding period to prevent an increase in the nod voltages of the sub pixels (P) and an increase in the brightness and luminance displayed through the sub pixels (P).

In case the display panel 10 is driven at a driving frequency of 240 Hz (PWM (240 Hz)), the timing controller 500 may divide and distinguish the first frame period (Anode Reset (1st)) of the image holding period into four sub frame periods to consecutively drive each sub pixel (P). When the display panel 10 is driven at the driving frequency of 240 Hz (PWM (240 Hz)), the timing controller 500 may consecutively supply a reference compensation voltage (Vp1, Vp2 and Vp3) during at least one sub frame period of sub frames, may prevent an increase in the node voltages of the sub pixels (P) and may prevent an increase in the brightness and luminance displayed through the sub pixels (P).

Next, an image display operation of each sub pixel (P) during the refresh period where an image is written is consecutively described as follows.

During an initialization period of the refresh period where an image data voltage is written in each sub pixel (P) to display an image, the second switching element (T2) of each sub pixel (P) may supply an initialization voltage (Vini) input from the data driver 300 or the power supply and the like to the fourth node (N4) and the fourth switching element (T4) to which the storage capacitor (C) and the driving switching element (DT) connect, in response to the first scan signal (Scan1) from the first gate line (GL1).

In this case, the fifth switching element (T5) may supply a high-potential voltage (VDD), input through the power supply and the like, to the first node (N1) connected with the third switching element (T3) in response to the second light emission control signal (EM2) input through the second light emission control line (EL2).

Next, during a compensation period of the refresh period, the first switching element (T1) of each sub pixel (P) may be switched (turned on) by the second scan signal (Scan2) from the second gate line (GL2), and may consecutively transmit an image data voltage (Data), input from a corresponding data line (DL), to the third node (N3) to which the driving switching element (DT) connects. Accordingly, a threshold voltage (Vth) based on the initialization voltage (Vini) and the image data voltage (Data) may be stored in the storage capacitor (C).

In this case, the fourth switching element (T4) may supply the threshold voltage (Vth), input through the second switching element (T2) and the storage capacitor (C), to the first node (N1) to which the driving switching element (DT) and the fifth switching element (T5, a light emission control element) connect, in response to the first scan signal (Scan1) from the first gate line (GL1). Accordingly, the third switching element (T2) may be switched (turned on) by a discharge voltage of the storage capacitor (C) such that the image data voltage, where the threshold voltage (Vth) is compensated, is supplied to the third node (N3) to which the driving switching element (DT) connects.

Next, during the image display period of the refresh period, the driving switching element (DT) of each sub pixel (P) may be switched (turned on) by the first light emission control signal (EM1) input through the first light emission control line (EL1), may supply an OLED driving voltage having magnitude corresponding to magnitude of the image data voltage, where the threshold voltage (Vth) is compensated, to an organic light-emitting diode, and may control the organic light-emitting diode such that the organic light-emitting diode emits light.

Figure 5:
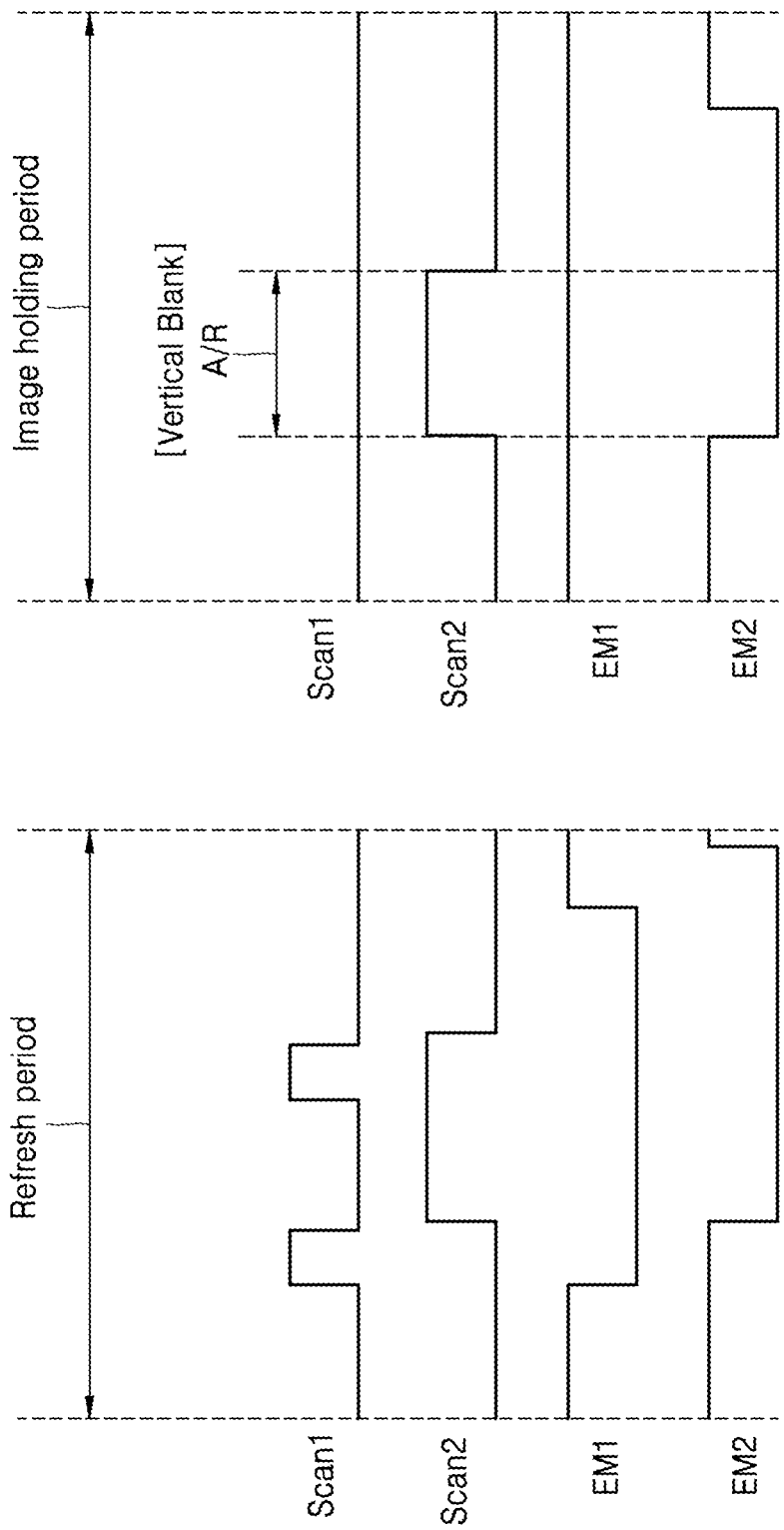
FIG. 5 is a timing chart illustrating gate driving signals input to sub pixels during an image holding period.

FIG. 5 is a timing chart illustrating gate driving signals input to sub pixels during an image holding period.

An Image display operation of each sub pixel (P) is consecutively described during the image holding period with reference to FIG. 2 and FIG. 5.

From the first frame period of the image holding period (Vertical Blank), the second switching element (T2) and the fourth switching element (T4) are kept turned off. That is, the first scan signal (Scan1) is kept inactivated.

The fifth switching element (T5), however, may respond to the second light emission control signal (EM2) input through the second light emission control line (EL2) to supply a high-potential voltage (VDD) input through the power supply and the like to the first node (N1) connected with the third switching element (T3).

Next, the first switching element (T1) is switched (turned on) by the second scan signal (Scan2) from the second gate line (GL2) and may consecutively transmit a reference compensation voltage (Vp1), input from a corresponding data line (DL), to the third node (N3) to which the driving switching element (DT) connects The reference compensation voltage (Vp1), which is a voltage lower than an image data voltage to prevent an increase in voltage of the third node (N3) and an increase in threshold voltage of the storage capacitor (C), may lower the voltage of the third node (N3) when the reference compensation voltage (Vp1) is input. Accordingly, the threshold voltage of the storage capacitor (C) may be lowered by the reference compensation voltage (Vp1). Thus, the third switching element (T3) may allow the threshold voltage (Vth) of the driving switching element (DT) to be compensated by a discharge voltage of the storage capacitor (C), thereby lowering an OLED driving voltage.

The driving switching element (DT) of each sub pixel (P) may be kept turned on during the image holding period (Vertical Blank) to maintain the OLED driving voltage that is compensated up to a lowered threshold voltage (Vth) by the reference compensation voltage (Vp1). Accordingly, the driving switching element (DT) may supply the OLED driving voltage, compensated up to the threshold voltage (Vth) by the reference compensation voltage (Vp1), to the organic light-emitting diode to maintain brightness and luminance of the organic light-emitting diode.

FIG. 6 is a control signal timing chart illustrating gate driving signals input to sub pixels on the basis of a change in driving frequencies of a display panel during an image holding period according to another embodiment.

Referring to FIGS. 2 and 6, the timing controller 500 and the gate driver 200 may control a period from the first frame period of the image holding period (Vertical Blank) to a driving period of the driving switching element (DT) and the fifth switching element (T5) of each sub pixel (P). That is, the timing controller 500 controls a turn-on period (and a timing) of the driving switching element (DT) and the fifth switching element (T5) to make it the same or different such that driving time of the organic light-emitting diode of each sub pixel (P) is the same or different.

Specifically, during the holding period (PWM OFF) where the driving period of the driving switching element (DT) and the fifth switching element (T5) of each sub pixel (P) is not controlled, the gate driver 200 may generate and supply the first and second light emission control signals (EM1 and EM2) such that the driving switching element (DT) and the fifth switching element (T5) of each sub pixel (P) are kept turned on. Thus, the organic light-emitting diode may keep emitting light.

During a period (EM2 only) where the turn-on/turn-off timing of the fifth switching element (T5) is controlled, the gate driver 200 may generate and supply the second light emission control signal (EM2) such that the driving switching element (DT) is kept turned on while the fifth switching element (T5) is repeatedly turned on/turned off. Thus, the gate driver 200 may control a timing of supply of a high-potential voltage source to each sub pixel (P).

During a period (PWM ON (EM1 and EM2)) where the turn-on/turn-off timing of the driving switching element (DT) and the fifth switching element (T5) is controlled, the gate driver 200 may generate and supply the first and second light emission control signals (EM1 and EM2) such that the driving switching element (DT) and the fifth switching element (T5) are all repeatedly turned on/turned off. Thus, the gate driver 200 may control the organic light-emitting diode such that the organic light-emitting diode is repeatedly turned on/turned off.

As described above, in the display device and driving method thereof according to the embodiments, a reference compensation voltage (Vp1, Vp2 and Vp3) for compensating a node voltage of each sub pixel (P) may be set during the image holding period (Vertical Blank) after the refresh period where image data (RGB) are input at the time of low-speed driving, and the node voltages of the pixels may be compensated on the basis of the unit of at least one frame during each image holding period (Vertical Blank) between the refresh periods.

Thus, the display device for low-speed driving and the driving method thereof according to the present disclosure may prevent a deterioration of image quality and may reduce electricity consumption during the image holding period.

The present disclosure has been described with reference to the embodiments illustrated in the drawings. However, the disclosure is not limited to the embodiments and the drawings set forth herein. Further, various modifications may be made by one having ordinary skill in the art within the scope of the technical spirit of the disclosure. Further, though not explicitly described during description of the embodiments of the disclosure, effects and predictable effects according to the configuration of the disclosure should be included in the scope of the disclosure.

DESCRIPTION OF THE SYMBOLS

10: Display panel
200: Gate driver
300: Data driver
400: Poser supply
500: Timing controller
600: Optical compensation tester
610: Optical sensor
620: Reference compensation voltage setter The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising: a display panel provided with a plurality of sub pixels and configured to display an image; and a timing controller configured to align image data in accordance with a driving frequency of the display panel, to supply the aligned image data to a data driver, and to control an output timing of a gate driving signal of a gate driver, wherein the data driver consecutively supplies an image data voltage based on the image data to each of the sub pixels during a refresh period set based on the driving frequency of the display panel, and supplies a reference compensation voltage to each of the sub pixels and drives each of the sub pixels to maintain the image data voltage during an image holding period, wherein the timing controller is configured to: generate a first gate control signal and a first data control signal such that each of the sub pixels consecutively displays an image during the refresh period, generate a second gate control signal and a second data control signal to maintain an image displayed by each of the sub pixels on the basis of a unit of each frame during the image holding period, and supply a first and a second gate signals to the gate driver and supply the first and the second data control signals to the data driver during each of the refresh period and the image holding period.

2. The display device of claim 1, wherein the timing controller is configured to control a driving timing of the gate and data drivers such that the display panel is driven during a plurality of frame periods divided into the refresh period and the image holding period according to the driving frequency of the display panel and,
to transmit the image data to the data driver on the basis of a unit of sub pixels in each horizontal line during the refresh period such that the image data voltage is supplied to each of the sub pixels, and to stop transmitting the image data during the image holding period.

3. The display device of claim 1, wherein each of the sub pixels is provided with an organic light-emitting diode and a pixel circuit configured to control an amount of emitted light and a light emission timing of the organic light-emitting diode, and
the pixel circuit has a source follower-type compensation circuit structure comprising first to fifth switching elements, a storage capacitor, and a driving switching element.

4. The display device of claim 3, wherein the second switching element supplies an initialization voltage to the storage capacitor and the driving switching element and the fourth switching element during an initialization period of the refresh period, and the fifth switching element supplies a high-potential voltage to a first node connected with the third switching element,
the first switching element transmits an image data voltage consecutively to the driving switching element and allows the initialization voltage and a threshold voltage based on the image data voltage to be stored in the storage capacitor, and the third switching element and the fourth switching element allow an image data voltage compensated by the threshold voltage to be transmitted to a driving switching element during a compensation period of the refresh period, and
the driving switching element supplies an OLED driving voltage, having a magnitude corresponding to a magnitude of the image data voltage where the threshold voltage is compensated, to the organic light-emitting diode during an image display period of the refresh period.

5. A display device, comprising:
a display panel provided with a plurality of sub pixels and configured to display an image; and
a timing controller configured to align image data in accordance with a driving frequency of the display panel, to supply the aligned image data to a data driver, and to control an output timing of a gate driving signal of a gate driver,
wherein the data driver consecutively supplies an image data voltage based on the image data to each of the sub pixels during a refresh period set based on the driving frequency of the display panel, and supplies a reference compensation voltage to each of the sub pixels and drives each of the sub pixels to maintain the image data voltage during an image holding period,
wherein the gate driver is configured to respond to a first gate control signal input from the timing controller during the refresh period, to consecutively generate a plurality of first and second scan pulses and a plurality of first and second light emission control signals, and to supply the generated scan pulses and light emission control signals to each of the sub pixels, and to respond to a second gate control signal input from the timing controller during an image display period, and to consecutively generate the plurality of first and second scan pulses and the plurality of first and second light emission control signals and to supply the generated scan pulses and light emission control signals to each of the sub pixels at a timing the same as or different from the refresh period.

6. A display device, comprising:
a display panel provided with a plurality of sub pixels and configured to display an image; and
a timing controller configured to align image data in accordance with a driving frequency of the display panel, to supply the aligned image data to a data driver, and to control an output timing of a gate driving signal of a gate driver,
wherein the data driver consecutively supplies an image data voltage based on the image data to each of the sub pixels during a refresh period set based on the driving frequency of the display panel, and supplies a reference compensation voltage to each of the sub pixels and drives each of the sub pixels to maintain the image data voltage during an image holding period,
wherein the data driver is configured to consecutively supply the image data voltage based on the image data to each sub pixel during the refresh period under the control of the timing controller, and
to supply the reference compensation voltage to each of the sub pixels on the basis of a unit of at least one frame during the image holding period and to drive each data line such that the image data voltage is maintained.

7. The display device of claim 6, wherein the data driver is configured to generate the reference compensation voltage such that the reference compensation voltage varies on the basis of the unit of at least one frame according to a compensation voltage level set by an optical compensation tester, and
to supply the generated reference compensation voltage on the basis of the unit of at least one frame to each of the sub pixels during the image holding period,
wherein a voltage value of the reference compensation voltage is set and generated to vary on the basis of the unit of at least one frame according to the reference compensation voltage level set by the optical compensation tester.

8. The display device of claim 7, wherein the optical compensation tester comprises an optical sensor and a reference compensation voltage setter, and the reference compensation voltage setter sets the reference compensation voltage level on the basis of an amount of change in brightness and luminance features of the display panel.

9. The display device of claim 6, wherein the data driver is configured to divide and distinguish a period of the at least one frame into a plurality of sub frame periods, and to generate the reference compensation voltage such that the reference compensation voltage varies on the basis of a unit of at least one sub frame according to a compensation voltage level set by the optical compensation tester, and
to supply the generated reference compensation voltage to each of the sub pixels during the image holding period on the basis of the unit of at least one sub frame,
wherein a voltage value of the reference compensation voltage is set and generated to vary on the basis of the unit of at least one frame according to the reference compensation voltage level set by the optical compensation tester.

10. A driving method of a display device, comprising:
aligning image data in accordance with a driving frequency of a display panel, supplying the aligned image data to a data driver and controlling a driving timing of the data driver;
controlling an output timing of a gate driving signal of a gate driver to drive a plurality of sub pixels provided at the display panel; and
driving the plurality of sub pixels such that the plurality of sub pixels displays an image by driving of the data driver,
the driving the plurality of sub pixels to display an image including:
consecutively supplying an image data voltage based on the image data to each of the sub pixels during a refresh period set based on the driving frequency of the display panel; and
supplying a reference compensation voltage to each of the sub pixels and driving each of the sub pixels during an image holding period such that the image data voltage is maintained,
wherein the controlling a driving timing of a data driver includes generating a first gate control signal and a first data control signal such that each of the sub pixels consecutively displays an image during the refresh period,
generating a second gate control signal and a second data control signal to hold an image displayed by each of the sub pixels on the basis of a unit of each frame during the image holding period, and
supplying a first and a second gate signals to the gate driver and supplying the first and the second data control signals to the data driver during each of the refresh period and the image holding period.

11. The driving method of claim 10, wherein the controlling a driving timing of a data driver includes:
dividing a plurality of frame periods into the refresh period and the image holding period according to the driving frequency of the display panel and controlling a driving timing of the data driver such that the display panel is driven,
transmitting the image data to the data driver on the basis of a unit of sub pixels in each horizontal line during the refresh period such that the image data voltage is supplied to each of the sub pixels, and stopping transmitting the image data during the image holding period.

12. The driving method of claim 10, wherein the driving the plurality of sub pixels to display an image includes:
responding to a first gate control signal input from a timing controller during a refresh period, consecutively generating a plurality of first and second scan pulses and a plurality of first and second light emission control signals, and supplying the generated scan pulses and light emission control signals to each of the sub pixels; and
responding to a second gate control signal input from the timing controller during an image display period, and consecutively generating the plurality of first and second scan pulses and the plurality of first and second light emission control signals and supplying the generated scan pulses and light emission control signals to each of the sub pixels at a timing the same as or different from the refresh period.

13. The driving method of claim 10, wherein the driving the plurality of sub pixels to display an image includes:
consecutively supplying the image data voltage based on the image data to each sub pixel during the refresh period under the control of the timing controller; and supplying the reference compensation voltage to each of the sub pixels on the basis of a unit of at least one frame during the image holding period and driving each data line and driving each data line such that the image data voltage is maintained.

14. The driving method of claim 13, wherein the supplying the reference compensation voltage on the basis of a unit of at least one frame includes:

generating the reference compensation voltage such that the reference compensation voltage varies on the basis of the unit of at least one frame according to a compensation voltage level set by an optical compensation tester; and supplying the generated reference compensation voltage on the basis of the unit of at least one frame to each of the sub pixels during the image holding period, wherein a voltage value of the reference compensation voltage is set and generated to vary on the basis of the unit of at least one frame according to the reference compensation voltage level set by the optical compensation tester.

15. The driving method of claim 13, wherein the supplying the reference compensation voltage on the basis of a unit of at least one frame includes:

dividing and distinguishing a period of the at least one frame into a plurality of sub frame periods, and generating the reference compensation voltage such that the reference compensation voltage varies on the basis of a unit of at least one sub frame according to a compensation voltage level set by the optical compensation tester; and supplying the generated reference compensation voltage to each of the sub pixels during the image holding period on the basis of the unit of at least one sub frame, wherein a voltage value of the reference compensation voltage is set and generated to vary on the basis of the unit of at least one frame according to the reference compensation voltage level set by the optical compensation tester.

16. The driving method of claim 10, wherein each of the sub pixels is provided with an organic light-emitting diode and a pixel circuit configured to control an amount of emitted light and a light emission timing of the organic light-emitting diode, and the pixel circuit has a source follower-type compensation circuit structure comprising first to fifth switching elements, a storage capacitor, and a driving switching element.

* * * * *